(12) United States Patent
Li et al.

(10) Patent No.: US 10,969,559 B2
(45) Date of Patent: Apr. 6, 2021

(54) LENS MODULE WITH ENHANCED STABILITY

(71) Applicant: TRIPLE WIN TECHNOLOGY(SHENZHEN) CO.LTD., Shenzhen (CN)

(72) Inventors: Kun Li, Shenzhen (CN); Shin-Wen Chen, New Taipei (TW); Ke-Hua Fan, Shenzhen (CN); Long-Fei Zhang, Guangdong (CN)

(73) Assignee: TRIPLE WIN TECHNOLOGY (SHENZHEN) CO.LTD., Shenzhen (CN)

( * ) Notice: Subject to any disclaimer, the term of this patent is extended or adjusted under 35 U.S.C. 154(b) by 277 days.

(21) Appl. No.: 16/182,564

(22) Filed: Nov. 6, 2018

(65) Prior Publication Data
US 2020/0003988 A1 Jan. 2, 2020

(30) Foreign Application Priority Data
Jun. 29, 2018 (CN) .......................... 201810700765.4

(51) Int. Cl.
*G02B 7/02* (2021.01)
*G02B 7/00* (2021.01)
*G02B 1/14* (2015.01)
*H05K 1/09* (2006.01)
*H05K 3/30* (2006.01)
(Continued)

(52) U.S. Cl.
CPC ............... *G02B 7/025* (2013.01); *G02B 1/14* (2015.01); *G02B 7/006* (2013.01); *H04N 5/2253* (2013.01); *H04N 5/2254* (2013.01); *H05K 1/09* (2013.01); *H05K 1/181* (2013.01); *H05K 3/305* (2013.01); *H05K 2201/10151* (2013.01)

(58) Field of Classification Search
CPC .......... G02B 7/025; G02B 7/006; G02B 1/14; H04N 5/2253; H04N 5/2254; H05K 1/09; H05K 1/181; H05K 3/305; H05K 2201/10151
USPC ....................................................... 359/819
See application file for complete search history.

(56) References Cited

U.S. PATENT DOCUMENTS

2015/0021730 A1\* 1/2015 Chen ................. H01L 27/14618
257/432

FOREIGN PATENT DOCUMENTS

| CN | 101431609 A | 5/2009 |
|---|---|---|
| CN | 104333679 A | 2/2015 |
| TW | 200938893 A | 9/2009 |

(Continued)

*Primary Examiner* — Marin Pichler
*Assistant Examiner* — Mitchell T Oestreich
(74) *Attorney, Agent, or Firm* — ScienBiziP, P.C.

(57) ABSTRACT

A lens module with physically stronger foundations and enhanced stability includes a circuit board, an image sensor thereon, a mounting bracket, an optical filter, and a lens unit. The mounting bracket on the circuit board has the image sensor. The optical filter on the mounting bracket is above the image sensor. The lens unit is connected to the mounting bracket facing away from the circuit board by a frame of adhesive. The surface of the mounting bracket facing away from the circuit board has positioning posts at corners of the surface of the mounting bracket. A surface of the lens unit connected to the mounting bracket has receiving grooves positioned at corners of the surface of the lens unit. The positioning posts are inserted into the receiving grooves.

8 Claims, 5 Drawing Sheets

(51) Int. Cl.
*H04N 5/225* (2006.01)
*H05K 1/18* (2006.01)

(56) References Cited

FOREIGN PATENT DOCUMENTS

TW 201505434 A 2/2015
TW 200938893 A * 9/2016

* cited by examiner

LENS MODULE WITH ENHANCED STABILITY

FIELD

The subject matter relates to imaging devices, and more particularly, to a lens module.

BACKGROUND

Portable electronic devices, such as cell phones, tablet computers, and multimedia players, usually include lens modules. The lens module may comprise a circuit board, an image sensor, a hollow mounting bracket, an optical filter, and a lens unit. During assembly, the image sensor is glued to the circuit board. The optical filter is glued to the mounting bracket. The mounting bracket containing the optical filter is then glued to the circuit board, to position the optical filter above the image sensor. Then, adhesive is applied on the mounting bracket, and the lens unit is glued to the mounting bracket by the adhesive.

However, an excess of adhesive may overflow over the mounting bracket. Furthermore, since the lens unit and the mounting bracket are connected only by adhesive, the bonding strength between the lens unit and the mounting bracket may be poor. Thus, the lens unit may be tilted with respect to or separated from the mounting bracket under lateral pressure.

Therefore, there is room for improvement in the art.

BRIEF DESCRIPTION OF THE DRAWINGS

Implementations of the present technology will now be described, by way of example only, with reference to the attached figures.

DETAILED DESCRIPTION

Figure 1:
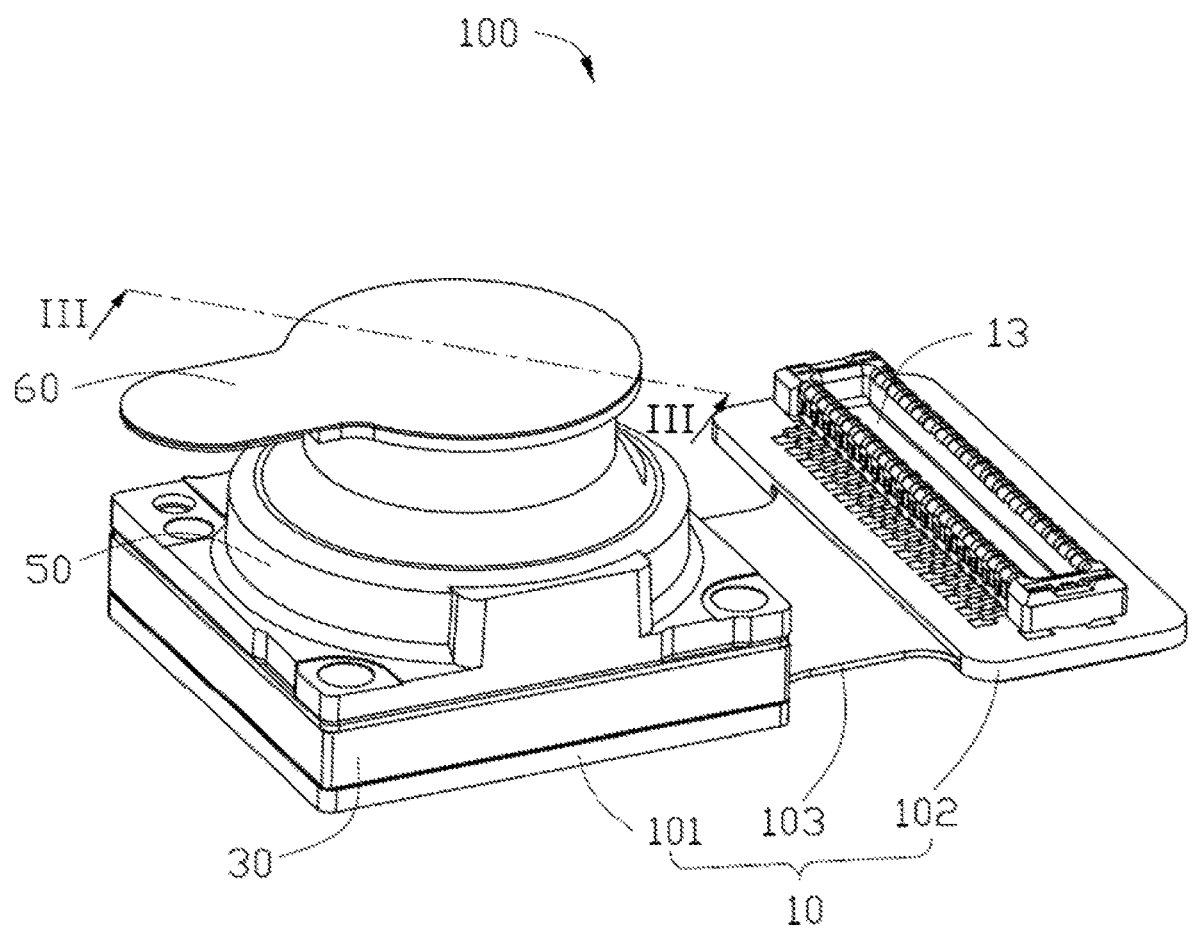
FIG. 1 is a diagrammatic view of an embodiment of a lens module.

It will be appreciated that for simplicity and clarity of illustration, where appropriate, reference numerals have been repeated among the different figures to indicate corresponding or analogous components. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 2:
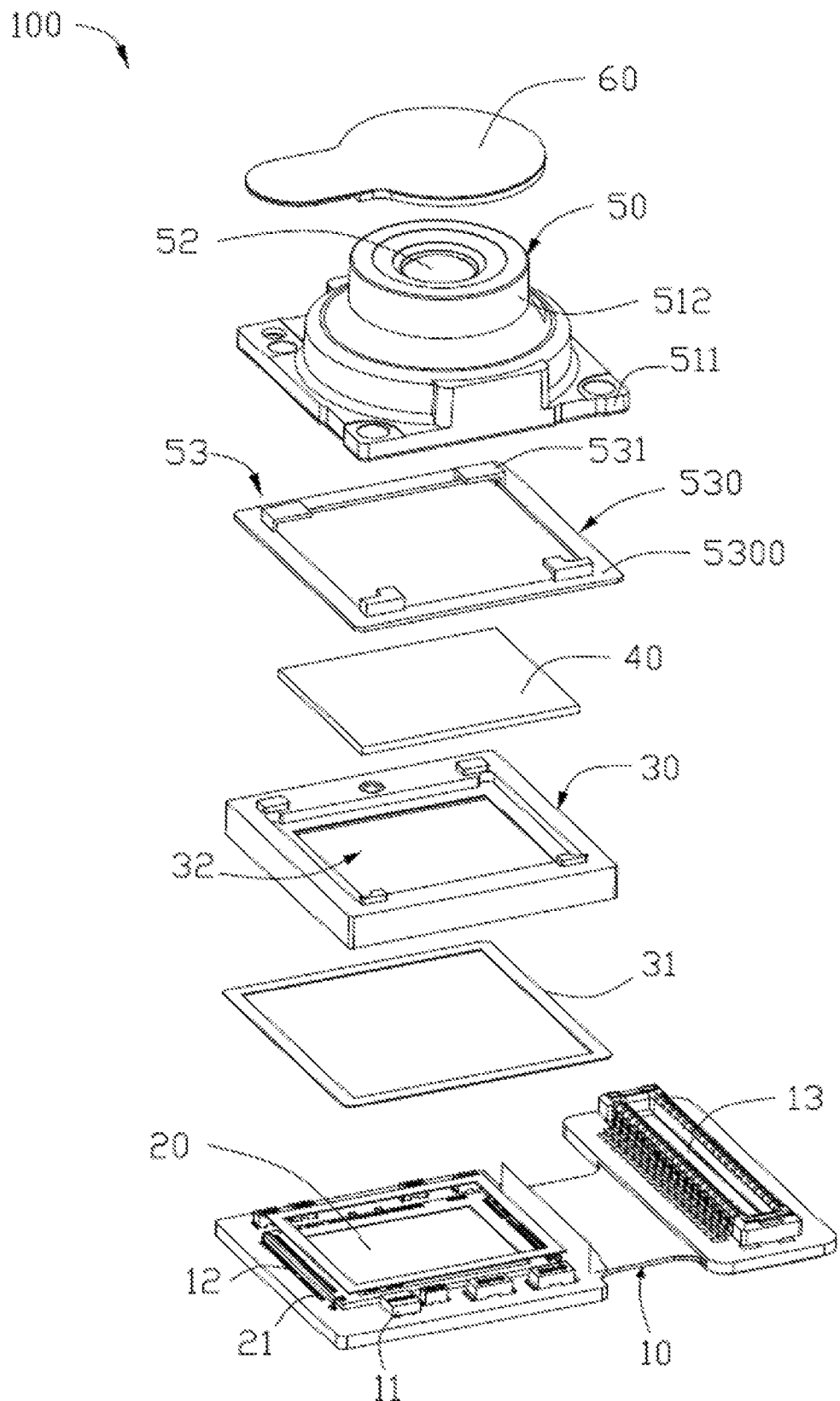
FIG. 2 is an exploded diagram of the lens module of FIG. 1.
Figure 3:
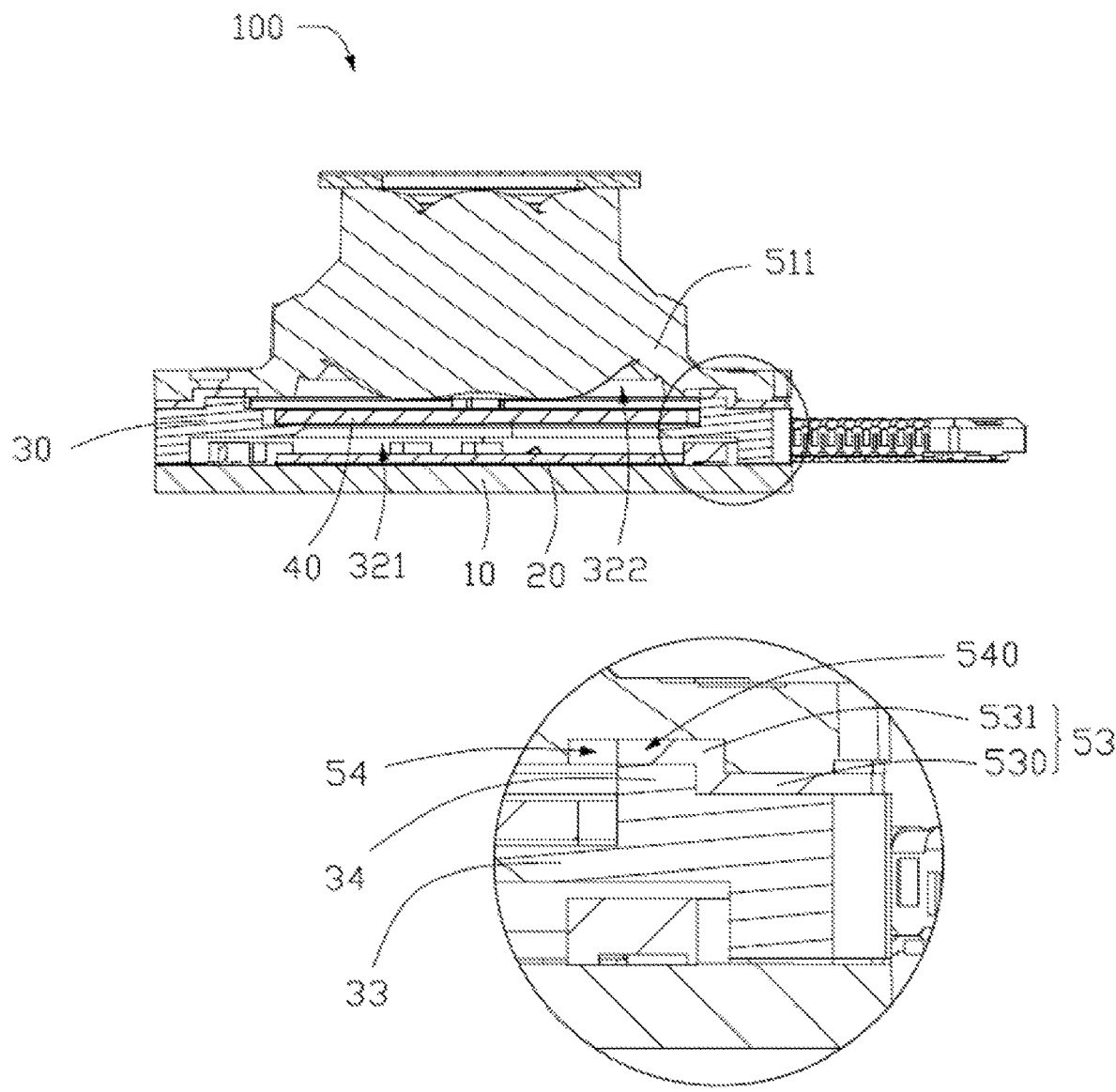
FIG. 3 is a cross-sectional view taken along line of FIG. 1.

FIGS. 1 to 3 illustrate an embodiment of a lens module 100. The lens module 100 can be used in an electronic device, such as a smart phone, a tablet computer, or a personal digital assistant (PDA). The lens module 100 comprises a circuit board 10, an image sensor 20, a hollow mounting bracket 30, an optical filter 40, a lens unit 50, and a protection cover 60.

The image sensor 20 is glued to a surface of the circuit board 10 by a first adhesive layer (not shown) disposed in a shape of a frame. The first adhesive layer can be made of optically clear adhesive (OCA). The circuit board 10 can be a rigid circuit board, a flexible circuit board, or a rigid-flexible circuit board. In an embodiment, the circuit board 10 is a rigid-flexible circuit board that comprises a first rigid board portion 101, a second rigid board portion 102, and a flexible board portion 103 positioned between the first rigid board portion 101 and the second rigid board portion 102. The image sensor 20 is glued to a surface of the first rigid board portion 101.

Furthermore, the surface of the first rigid board portion 101 which has the image sensor 20 further comprises electronic components 11 and edge connectors (gold fingers 12). The electronic components 11 and the gold fingers 12 may surround the image sensor 20. Metallic wires 21 can be arranged on edges of a surface of the image sensor 20 facing away from the circuit board 10. The metallic wires 21 match and are electrically connected to the gold fingers 12. In an embodiment, the image sensor 20 can be a Complementary Metal Oxide Semiconductor (CMOS) sensor or a Charge Coupled Device (CCD) sensor. The metallic wires 21 can be made of metal having good conductivity, such as gold (Au). The electronic components 11 can be resistors, capacitors, diodes, triodes, relays, or electrically erasable programmable read only memories (EEPROMs).

The second rigid board portion 12 has an electronic connecting component 13 on one surface. The electronic connecting component 13, the electronic components 11, and the gold fingers 12 can be on the same surface of the circuit board 10. The electronic connecting component 13 can be a connector, edge or otherwise.

The mounting bracket 30 is glued to the surface of the circuit board 10 (for example, on the first rigid board portion 101) which has the image sensor 20 by a second adhesive layer 31 disposed in a shape of a frame. The mounting bracket 30 is substantially square, and has a receiving hole 32 that passes through the mounting bracket 30. The receiving hole 32 is wider than the image sensor 20, thereby allowing the image sensor 20 to be received in the receiving hole 32. In an embodiment, the electronic components 11 and the gold fingers 12 are also received in the receiving hole 32.

The optical filter 40 is glued to the mounting bracket 30 by a third adhesive layer 41 resembling a frame in shape, and is positioned above the image sensor 20. FIG. 3 shows in an embodiment, a flange 33 formed on an inner wall of the receiving hole 32. The flange 33 divides the receiving hole 32 into a first receiving space 321 close to the circuit board 10 and a second receiving space 322 facing away from the circuit board 10. The image sensor 20 is received in the first receiving space 321. The optical filter 40 is received in the second receiving space 321, and is glued to and supported by the flange 33. A surface of the optical filter 40 facing away from the circuit board 10 is substantially flush with a surface of the mounting bracket 30 facing away from the circuit board. Thus, a total depth of the lens module 100 can be decreased. Furthermore, the third adhesive layer 41 can be made of OCA. The optical filter 40 can be an IR cut-off filter that can remove infrared light from incoming light.

Figure 4:
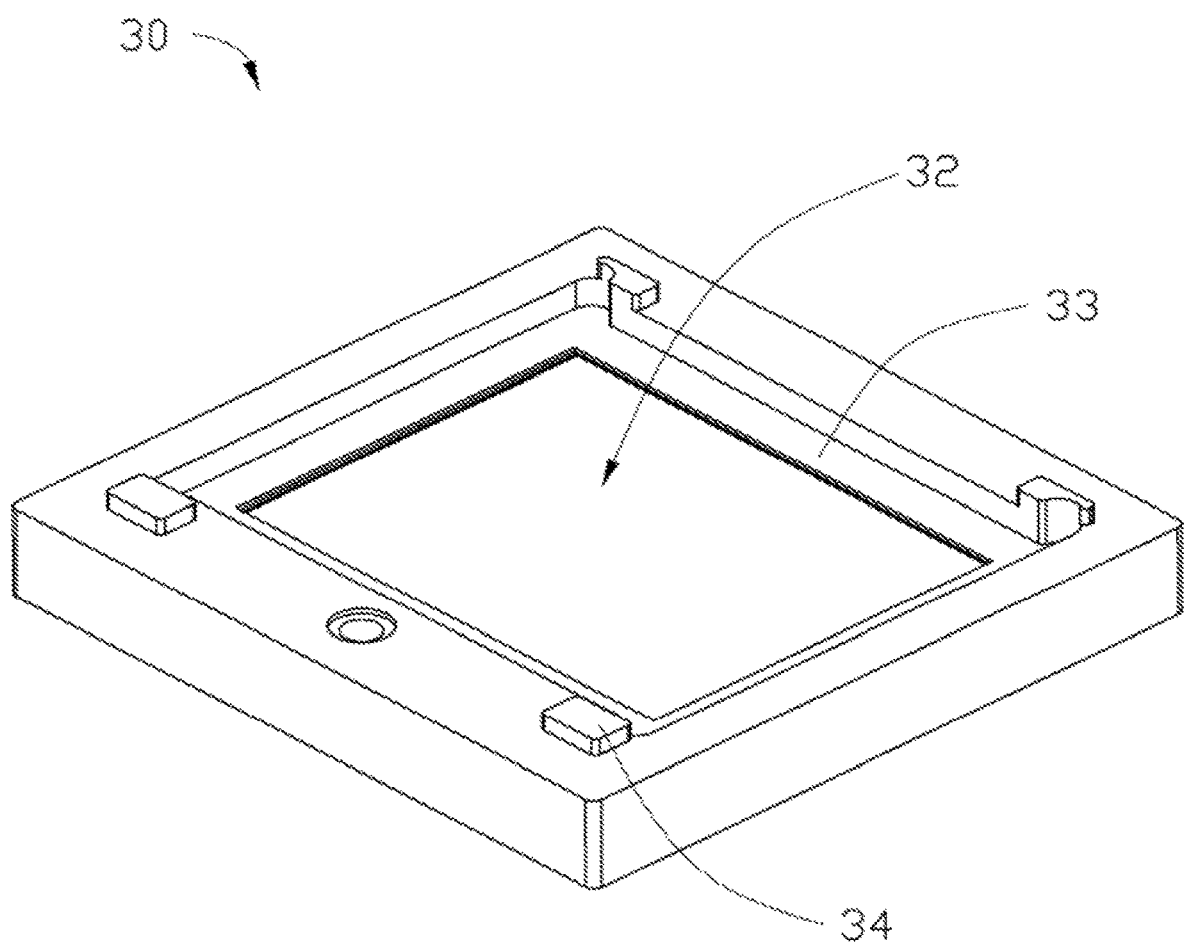
FIG. 4 is a diagrammatic view of a mounting bracket of the lens module of FIG. 1.

The lens unit 50 is glued to the surface of the mounting bracket 30 facing away from the circuit board 10 by a fourth adhesive layer 53. FIG. 4 shows the surface of the mounting bracket 30 facing away from the circuit board 10 having a plurality of positioning posts 34. The positioning posts 34 are positioned at corners of the surface of the mounting bracket 30. A surface of the lens unit 50 connected to the mounting bracket 30 has a plurality of receiving grooves 54. The receiving grooves 54 are positioned at corners of the surface of the lens unit 50. The positioning posts 34 are inserted into the receiving grooves 54. There can be four positioning posts 34 and four receiving grooves 54.

Figure 5:
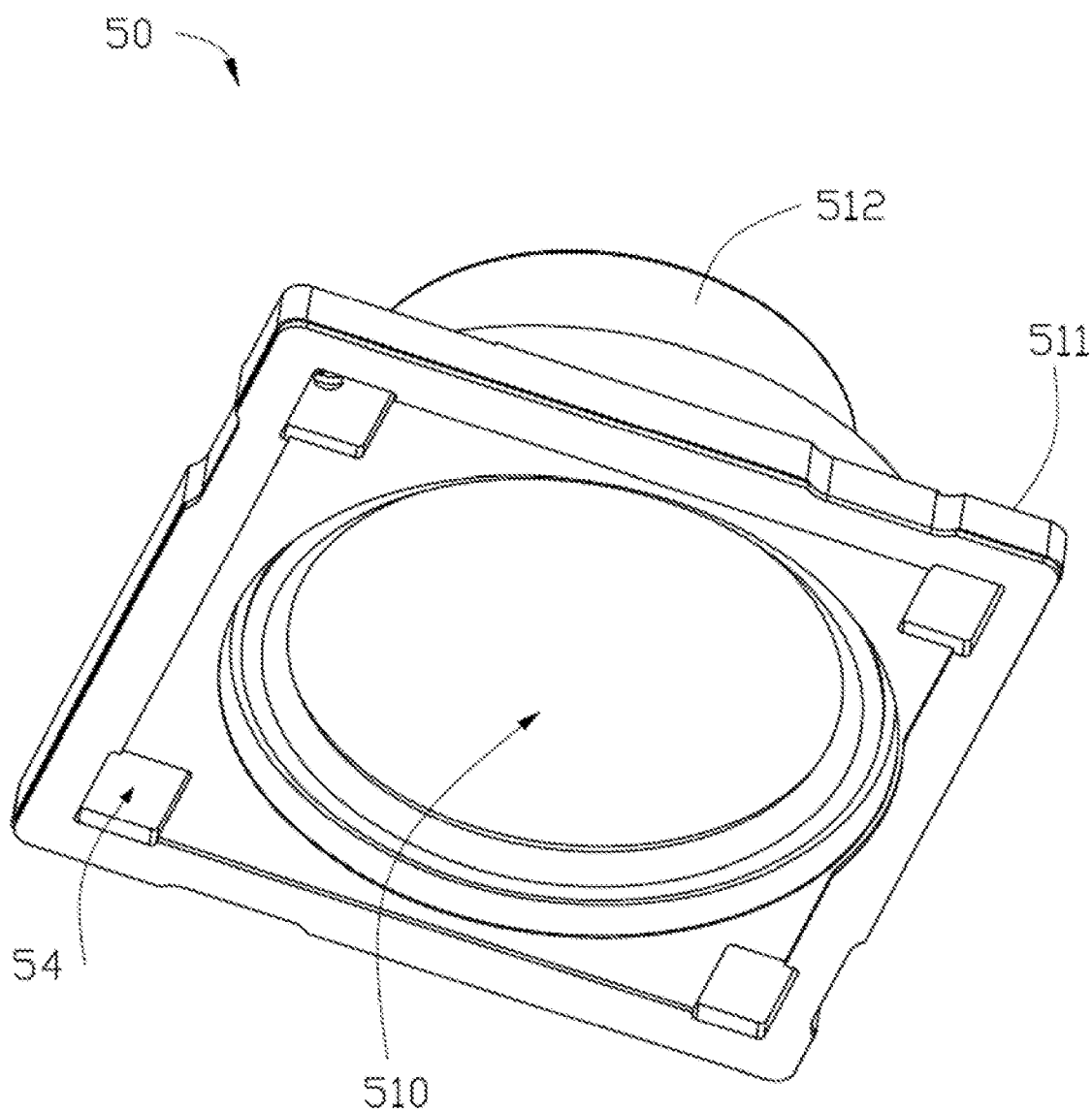
FIG. 5 is a diagrammatic view of a lens unit of the lens module of FIG. 1, from another angle.

FIG. 5 shows, in an embodiment, the lens unit 50 comprising a lens holder 51 and a lens 52. The lens holder 51 has a through hole 510. The lens 52 is received in the through hole 510. In an embodiment, the lens 52 is integrally formed with the lens holder 51. The lens holder 51 is glued to the mounting bracket 30. The lens 52 is positioned above the optical filter 40. The lens holder 51 and the lens 52 can be made of resin.

Furthermore, the lens holder 51 comprises a hollow and substantially square first holder portion 511 and a hollow and substantially circular second holder portion 512. The first holder portion 511 is glued to the mounting bracket 30. The second holder portion 512 is connected to a surface of the first holder portion 511 facing away from the mounting bracket 30. The first holder portion 511 matches the mounting bracket 30 in shape. The fourth adhesive layer 53 is also frame-shaped and substantially square, and comprises a main adhesive portion 530 and a plurality of extension portions 531. The main adhesive portion 530 comprises four sides 5300 connected end-to-end. The four sides 5300 surround the positioning posts 34. Bottom surface of inner wall of each receiving groove 54 and top surface and outer wall of the corresponding positioning post 34 cooperatively define a gap 540. Each extension portion 531 extends from one corner of the main adhesive portion 530 and infills one gap 540. The extension portion 531 increases the available gluing area between the lens unit 50 and the mounting bracket 30.

The protection cover 60 covers the lens unit 50.

When in use, the optical filter 40 removes infrared light. The image sensor 20 converts the light which is received to electrical signals, and outputs the electrical signals to the circuit board 10. The circuit board 10 processes the electrical signals to form images. The lens module 100 can be mounted to other components (not shown) of the electronic device through the electronic connecting component 13.

With the above configuration, the positioning posts 34 are inserted into the receiving grooves 54 to connect the mounting bracket 30 to the lens unit 50. Thus, when lateral pressure is applied to the lens module 100, separation of the lens unit 50 and the mounting bracket 30 is rendered less likely. Furthermore, since the positioning posts 34 are positioned at corners of the surface of the mounting bracket 30, the best use of the area between an outer surface of the mounting bracket 30 and the inner wall of the receiving hole 32 can be made, to increase the width of the positioning posts 34. Thus, the connecting strength between the lens unit 50 and the mounting bracket 30 can further be increased. Finally, the positioning posts 34 block a portion of light beams which would otherwise pass by the fourth adhesive layer 53. Thus, flares or stains in the image can be avoided.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present exemplary embodiments, to the full extent indicated by the plain meaning of the terms in which the appended claims are expressed.

What is claimed is:

1. A lens module comprising:
 a circuit board;
 an image sensor connected to a surface of the circuit board;
 a hollow mounting bracket connected to the surface of the circuit board which has the image sensor, the image sensor received in the mounting bracket;
 an optical filter connected to mounting bracket and positioned above the image sensor; and
 a lens unit connected to a surface of the mounting bracket facing away from the circuit board by an adhesive layer;
 wherein, the surface of the mounting bracket facing away from the circuit board has a plurality of positioning posts, the plurality of positioning posts is positioned at corners of the surface of the mounting bracket, a surface of the lens unit connected to the mounting bracket has a plurality of receiving grooves, the plurality of receiving grooves is positioned at corners of the surface of the lens unit, the plurality of positioning posts is inserted into the plurality of receiving grooves;
 wherein the lens unit comprises a lens holder and a lens received in the lens holder, the lens holder is connected to the mounting bracket, the lens is positioned above the optical filter;
 wherein the lens holder comprises a hollow and square first holder portion and a hollow and circular second holder portion, the first holder portion is connected to the mounting bracket, the second holder portion is connected to a surface of the first holder portion facing away from the mounting bracket, the adhesive layer is square and comprises a main adhesive portion, the a main adhesive portion comprises four sides connected end-to-end, the four sides surround the plurality of positioning posts;
 wherein the adhesive layer further comprises a plurality of extension portions, bottom surface and inner wall of each of the plurality of receiving grooves and top surface and outer wall of the corresponding one of the plurality of positioning posts cooperatively define a gap, each of the plurality of extension portions extends from one corner of the main adhesive portion and infills one gap.

2. The lens module of claim 1, wherein the circuit board is a rigid-flexible circuit board that comprises a first rigid board portion, a second rigid board portion, and a flexible board portion positioned between the first rigid board portion and the second rigid board portion, the image sensor is connected to a surface of the first rigid board portion.

3. The lens module of claim 2, wherein the surface of the first rigid board portion which has the image sensor further comprises electronic components and gold fingers, the electronic components and the gold fingers surround the image sensor, metallic wires are arranged on edges of a surface of the image sensor facing away from the circuit board, the metallic wires match and are electrically connected to the gold fingers.

4. The lens module of claim 2, wherein the second rigid board portion has an electronic connecting component on one surface.

5. The lens module of claim 1, wherein the mounting bracket defines a receiving hole that passes through the mounting bracket, the receiving hole is wider than the image sensor, thereby allowing the image sensor to be received in the receiving hole.

6. The lens module of claim 5, wherein a flange is formed on an inner wall of the receiving hole, the flange divides the receiving hole into a first receiving space close to the circuit board and a second receiving space facing away from the circuit board, the image sensor is received in the first receiving space, the optical filter is received in the second receiving space, and is connected to and supported by the flange.

7. The lens module of claim 6, wherein a surface of the optical filter facing away from the circuit board is flush with a surface of the mounting bracket facing away from the circuit board.

8. The lens module of claim 1, further comprising a protection cover covering the lens unit.

\* \* \* \* \*